(12) United States Patent
Denker et al.

(10) Patent No.: US 8,212,241 B2
(45) Date of Patent: Jul. 3, 2012

(54) ORGANIC FIELD-EFFECT TRANSISTOR

(75) Inventors: Ulrich Denker, Dresden (DE); Tobias Canzler, Dresden (DE); Qiang Huang, Dresden (DE)

(73) Assignee: Novaled AG, Dresden (DE)

( * ) Notice: Subject to any disclaimer, the term of this patent is extended or adjusted under 35 U.S.C. 154(b) by 165 days.

(21) Appl. No.: 12/534,394

(22) Filed: Aug. 3, 2009

(65) Prior Publication Data

US 2010/0051923 A1 Mar. 4, 2010

(30) Foreign Application Priority Data

Aug. 4, 2008 (DE) .......................... 10 2008 036 063

(51) Int. Cl.
*H01L 51/10* (2006.01)

(52) U.S. Cl. ............ 257/40; 257/E51.006; 257/E51.023

(58) Field of Classification Search .................... 257/40, 257/E51.006, E51.023
See application file for complete search history.

(56) References Cited

U.S. PATENT DOCUMENTS

| | | | |
|---|---|---|---|
| 4,356,429 A | 10/1982 | Tang | |
| 4,769,292 A | 9/1988 | Tang et al. | |
| 5,093,698 A | 3/1992 | Egusa | |
| 5,500,537 A | 3/1996 | Tsumura et al. | |
| 5,703,436 A | 12/1997 | Forrest et al. | |
| 5,757,026 A | 5/1998 | Forrest et al. | |
| 5,811,833 A | 9/1998 | Thompson | |
| 5,840,217 A | 11/1998 | Lupo et al. | |
| 5,917,280 A | 6/1999 | Burrows et al. | |
| 5,969,474 A | 10/1999 | Aria | |
| 5,989,785 A | 11/1999 | Ishihara et al. | |
| 6,023,073 A | 2/2000 | Strite | |
| 6,107,734 A | 8/2000 | Tanaka et al. | |
| 6,274,980 B1 | 8/2001 | Burrows et al. | |
| 6,303,238 B1 | 10/2001 | Thompson et al. | |
| 6,310,360 B1 | 10/2001 | Forrest et al. | |
| 6,337,492 B1 | 1/2002 | Jones et al. | |
| 6,406,804 B1 | 6/2002 | Higashi | |
| 6,437,769 B1 | 8/2002 | Kobayashi | |

(Continued)

FOREIGN PATENT DOCUMENTS

CA 2549309 9/2005

(Continued)

OTHER PUBLICATIONS

"adjacent." Dictionary.com Unabridged. Random House, Inc. Dec. 30, 2011. <Dictionary.com http://dictionary.reference.com/browse/adjacent>.*

(Continued)

*Primary Examiner* — Wensing Kuo
(74) *Attorney, Agent, or Firm* — Sutherland Asbill & Brennan, LLP

(57) ABSTRACT

The invention relates to an organic field-effect transistor, in particular an organic thin-layer field-effect transistor, with a gate electrode, a drain electrode and a source electrode, an active layer of organic material which during operation is configured to form an electrical line channel, a dielectric layer which electrically isolates the active layer from the gate electrode, a dopant material layer which consists of a molecular dopant material whose molecules consist of two or more atoms and which dopant material is an electrical dopant for the organic material of the active layer, and wherein the dopant material layer is formed in a boundary surface region between the active layer and the dielectric layer or is formed adjacent to the boundary surface region.

9 Claims, 4 Drawing Sheets

U.S. PATENT DOCUMENTS

Figure 1:
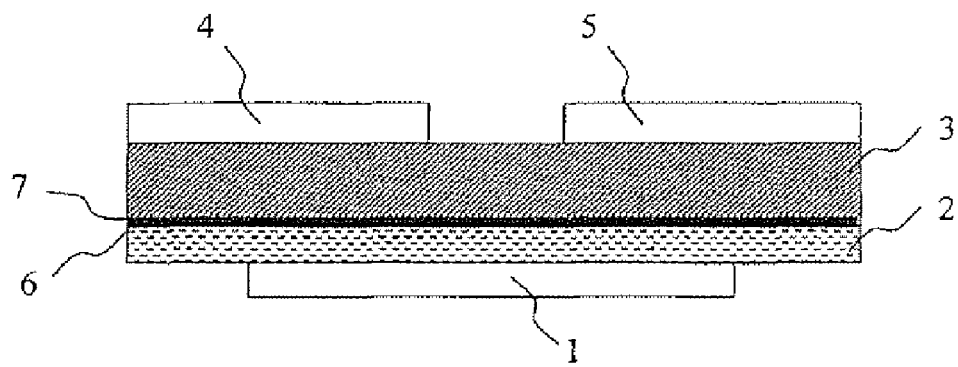

| | | | |
|---|---|---|---|
| 6,555,840 B1 | 4/2003 | Hudson et al. |
| 6,566,807 B1 | 5/2003 | Fujita et al. |
| 6,573,651 B2 | 6/2003 | Adachi et al. |
| 6,579,422 B1 | 6/2003 | Kakinuma |
| 6,580,027 B2 | 6/2003 | Forrest et al. |
| 6,589,673 B1 | 7/2003 | Kido et al. |
| 6,645,645 B1 | 11/2003 | Adachi et al. |
| 6,720,573 B2 | 4/2004 | Son |
| 6,734,457 B2 | 5/2004 | Yamazaki |
| 6,835,470 B1 | 12/2004 | Magain |
| 6,867,538 B2 | 3/2005 | Adachi et al. |
| 6,878,297 B1 | 4/2005 | Berger |
| 6,897,473 B1 | 5/2005 | Burroughes et al. |
| 6,900,588 B2 | 5/2005 | Adachi et al. |
| 6,908,783 B1 | 6/2005 | Kuehl et al. |
| 6,911,666 B2 | 6/2005 | Voutsas et al. |
| 6,933,522 B2 | 8/2005 | Lin |
| 6,936,961 B2 | 8/2005 | Liao et al. |
| 6,965,197 B2 | 11/2005 | Tyan |
| 6,979,414 B2 | 12/2005 | Hosokawa et al. |
| 7,001,536 B2 | 2/2006 | Thompson et al. |
| 7,074,500 B2 | 7/2006 | Pfeiffer |
| 7,161,292 B2 | 1/2007 | Leo |
| 7,301,167 B2 | 11/2007 | Ko |
| 7,473,410 B1 | 1/2009 | Huffman et al. |
| 2001/0033136 A1 | 10/2001 | Kawase |
| 2002/0030440 A1 | 3/2002 | Shunpei |
| 2002/0041975 A1 | 4/2002 | Ueda et al. |
| 2002/0048688 A1 | 4/2002 | Fukuoka et al. |
| 2002/0071082 A1 | 6/2002 | Hiroyuki et al. |
| 2002/0084993 A1 | 7/2002 | Teneya |
| 2002/0098379 A1 | 7/2002 | Arakane |
| 2002/0109136 A1 | 8/2002 | Tetsushi et al. |
| 2003/0020073 A1 | 1/2003 | Long et al. |
| 2003/0042848 A1 | 3/2003 | Park et al. |
| 2003/0052616 A1 | 3/2003 | Homer et al. |
| 2003/0098946 A1 | 5/2003 | Blaessing et al. |
| 2003/0127973 A1 | 7/2003 | Weaver et al. |
| 2003/0146443 A1 | 8/2003 | Atsushi et al. |
| 2003/0170491 A1 | 9/2003 | Liao et al. |
| 2003/0178619 A1 | 9/2003 | Forrest et al. |
| 2003/0189401 A1 | 10/2003 | Kido et al. |
| 2003/0230980 A1 | 12/2003 | Forrest et al. |
| 2004/0012980 A1 | 1/2004 | Sugiura et al. |
| 2004/0032220 A1 | 2/2004 | Cok et al. |
| 2004/0062949 A1 | 4/2004 | Pfeiffer et al. |
| 2004/0067324 A1 | 4/2004 | Lazarev et al. |
| 2004/0104394 A1 | 6/2004 | Lin et al. |
| 2004/0113547 A1 | 6/2004 | Son |
| 2004/0119400 A1 | 6/2004 | Takahashi et al. |
| 2004/0150330 A1 | 8/2004 | Suh et al. |
| 2004/0183067 A1 | 9/2004 | Strip |
| 2004/0191952 A1 | 9/2004 | Shtein et al. |
| 2004/0201018 A1 | 10/2004 | Yamahara et al. |
| 2004/0214041 A1 | 10/2004 | Lu |
| 2004/0227460 A1 | 11/2004 | Liao et al. |
| 2004/0235209 A1 | 11/2004 | Hasegawa et al. |
| 2004/0251816 A1 | 12/2004 | Leo et al. |
| 2005/0029933 A1 | 2/2005 | Liao et al. |
| 2005/0040390 A1 | 2/2005 | Pfeiffer et al. |
| 2005/0040392 A1 | 2/2005 | Wu et al. |
| 2005/0053801 A1 | 3/2005 | Eischner et al. |
| 2005/0061232 A1 | 3/2005 | Werner et al. |
| 2005/0073251 A1 | 4/2005 | Yoshifumi |
| 2005/0086251 A1 | 4/2005 | Hatscher et al. |
| 2005/0095736 A1 | 5/2005 | Padiyath et al. |
| 2005/0110009 A1 | 5/2005 | Blochwitz-Nimoth et al. |
| 2005/0118745 A1 | 6/2005 | Yamazaki et al. |
| 2005/0173700 A1 | 8/2005 | Liao et al. |
| 2005/0189875 A1 | 9/2005 | Nakada |
| 2005/0218797 A1 | 10/2005 | Bechtel et al. |
| 2005/0255334 A1 | 11/2005 | Kang et al. |
| 2005/0269943 A1 | 12/2005 | Hack et al. |
| 2005/0270279 A1 | 12/2005 | Giraldo et al. |
| 2006/0033115 A1 | 2/2006 | Blochwitz et al. |
| 2006/0038170 A1 | 2/2006 | Brunschwiler et al. |
| 2006/0061266 A1 | 3/2006 | Kang et al. |
| 2006/0065904 A1 | 3/2006 | Uemura et al. |
| 2006/0145365 A1 | 7/2006 | Halls et al. |
| 2006/0202196 A1 | 9/2006 | Kawakami et al. |
| 2006/0231843 A1 | 10/2006 | Qin et al. |
| 2006/0232992 A1 | 10/2006 | Bertram et al. |
| 2006/0238112 A1 | 10/2006 | Kasama et al. |
| 2006/0250076 A1 | 11/2006 | Hofmann et al. |
| 2006/0273310 A1 | 12/2006 | Birnstock et al. |
| 2007/0034860 A1 | 2/2007 | Nakamura et al. |
| 2007/0051946 A1 | 3/2007 | Walzer et al. |
| 2007/0090351 A1* | 4/2007 | Park et al. .................. 257/40 |
| 2007/0278479 A1 | 12/2007 | Werner et al. |
| 2008/0143250 A1 | 6/2008 | Blochwitz-Nimoth et al. |
| 2008/0203406 A1 | 6/2008 | He et al. |
| 2008/0164807 A1 | 7/2008 | Hofmann et al. |
| 2009/0009071 A1 | 1/2009 | Murano et al. |
| 2009/0009072 A1 | 1/2009 | Wellmann et al. |

FOREIGN PATENT DOCUMENTS

| | | |
|---|---|---|
| DE | 19916745 | 10/2000 |
| DE | 10209789 | 9/2003 |
| DE | 10229231 | 1/2004 |
| EP | 1227466 | 7/2002 |
| EP | 1282101 | 2/2003 |
| EP | 1318499 | 6/2003 |
| GB | 2361356 | 10/2001 |
| GB | 2388236 | 11/2003 |
| GB | 2390215 | 12/2003 |
| GB | 2392023 | 2/2004 |
| JP | 5931865 | 2/1984 |
| JP | 03208689 | 9/1991 |
| JP | 07-142169 | 11/1993 |
| JP | 05-034692 | 12/1993 |
| JP | 11283750 | 10/1999 |
| JP | 2000-231992 | 8/2000 |
| JP | 2003203769 | 7/2003 |
| JP | 2003297561 | 10/2003 |
| JP | 2004119197 | 4/2004 |
| JP | 2004214120 | 7/2004 |
| JP | 2004234942 | 8/2004 |
| JP | 2005156925 | 6/2005 |
| KR | 0522687 | 10/2005 |
| TW | 200401017 | 1/2004 |
| WO | WO 99/48160 | 9/1999 |
| WO | WO 01/27910 | 4/2001 |
| WO | WO 02/37580 | 5/2002 |
| WO | WO 02/093664 | 11/2002 |
| WO | WO 03/069958 | 8/2003 |
| WO | WO 03/088271 | 10/2003 |
| WO | WO 2004/025615 | 3/2004 |
| WO | WO 2004/059606 | 7/2004 |
| WO | WO 2004/097954 | 11/2004 |
| WO | WO 2005/008801 | 1/2005 |
| WO | WO 2005/089288 | 9/2005 |

OTHER PUBLICATIONS

Adachi, C. et al., "Efficient electrophosphorescence using a doped ambipolar conductive molecular organic thin film," Organic Electronics 2, (2001), pp. 37-43.

Adachi, C. et al., "High-efficiency organic electrophorescent devices with tris (2-phenylpyricline) iridium doped into electron-transporting materials," App. Phys. Lett. vol. 77, No. 6, Aug. 7, 2000.

Adachi, C. et al., "Nearly 100% internal phosphorescence efficiency in an organic light emitting device," Journal of Applied Physics (2001), vol. 90:10, pp. 5048-5051.

Adachi, et al. "Electroluminescence in Organic Films with Three-Layer Structure," Japanese Journal of Applied Physics, 27, L269 (1988).

Akiba, Kin-Ya et al., "Direct Synthesis of 2,2-diaryl-3-methyl-2,3-dihydrobenzothiazoles from 3-methyl-2,3-dihydrobenzothiazole-2-thione and some mechanistic aspects," Bulletin of the Chemical Society of Japan, vol. 52(1), pp. 156-159, (1979).

Ammermann, D. et al., "Photonic devices based on crystalline organic semiconductors for optoelectronic integrated circuits," Jps. J. Appl. Phys. Pt. 1 (1995) vol. 34, pp. 1293-1297.

Anderson, J.D. et al., "Electrochemistry and Electrogenerated Chemiluminescence Processes of the Componenets of Aluminum Quinolate/Triarylamine, and Related Organic Light emitting Diodes," J. Am. Chem. Soc., 1998, 120, pp. 9646-9655.

Baldo, et al. "Highly efficient phosphorescent emission from organic electroluminescent devices," Nature, vol. 395, Sep. 10, 1998, pp. 151-154.

Baldo, M. A. et al., "High efficiency fluorescent organic light-emitting devices using a phosphorescent sensitizer," Nature, (2000), vol. 403, pp. 750-753.

Baldo, M. A., et al., "Transient analysis of organic electrophosphorescence: I. Transient analysis of triplet energy transfer," Physical Review B, (2000), vol. 62:16, pp. 10958-10966.

Baldo, M. A. et al., "Very high-efficiency green organic light-emitting devices based on electrophosphorescence," Applied Physics Letters, (1999), vol. 75:1, pp. 4-6.

Baldo, M. A. et al., "Transient analysis of organic electrophosphorescence: II. Transient analysis of triplet-triplet-annihilation energy transfer," Physical Review B, (2000), vol. 62:16, pp. 10967-10977.

Baldo, M., et al., "Organic vapor phase deposition," Advanced Materials, 1998, 10, No. 18, pp. 1505-1514

Bandyopadhyay, A, et al. "Large conductance switching and memory effects in organic molecules for data-storage applications," Appl. Phys. Lett. 82, 1215 (2003).

Bard, A. J., Faulkner, R.J., Electrochemical Methods: Fundamentals and Applications, Wiley, 2nd Ed., 2000 (Chapter 2).

Bard, A. J., Faulkner, R.J., Electrochemical Methods: Fundamentals and Applications, Wiley, 2nd Ed., 2000 (Chapter 6).

Bastard, G., "Wave mechanics applied to semiconductor heterostructures," The Editions of Physique, (1988) pp. 64-67.

Baumgartel, H. et al. "Intracluster Electron and Proton Transfer in Ionic Ortho-Xylene/Dimethylamine Aggregates," Ber Bunsenges. Phys. Chem, 101, 783-788 (1997) No. 5.

Baumgartel, H. et al., "Polarographische Untersuchungen zur Konformation von 1.2.3.4.5-pentaarylimidazoliumkationen," Ber. Bunsenges (1972) 76/2, 94-100.

Bernanose, Andre et al. "Sur un nouvea mode d'emission lumineuse chez certains composes organiques," J. de Chimie Physique, 1953, No. 1, pp. 64-68.

Birnstock, J. et al., "High Efficiency Top Emitting OLEDs on a-Si Active Matrix Backplanes with Large Aperture Ratio," OLED1: Panel, IDW '04, Dec. 8, 2004.

Blochwitz, J. "Organic Light-Emitting Diodes with Doped Charge Transport Layers" Dissertation: Technische Universitat Dresden (2001). http://deposit.ddb.de/cgi-bin/dokserv?idn=963580051&dok_var=d1&dok_ext=pdf&filename=963580051.pdf.

Blochwitz, J. et al., "Interface electronic structure of organic semiconductors with controlled doping levels," Org. Electronics 2, 97 (2001).

Blochwitz, J., et al., "Low voltage organic light emitting diodes featuring doped phthalocyanine as hole transport material," Applied Physics Letters, vol. 73, No. 6, Aug. 10, 1998, pp. 729-731.

Blochwitz, J., et al., "Non-polymeric OLEDs with a doped amorphous hole transport layer and operating voltages down to 3.2 V to achieve 100 cd/m$^2$," Synthetic Metals, (2002), vol. 127, pp. 169-173.

Bloom, C. J. et al., "Low work function reduced metal complexes as cathodes in organic electroluminescent devices," J. of Phyiscal Chemistry B, vol. 107, No. 13, pp. 2933-2938, (2003).

Campbell, A. J. et al, "Dispersive electron transport in an electroluminescent polyfluorene copolymer measured by the current integration time of flight method," Applied Physics Letters, Oct. 1, 2001, vol. 79, No. 14 pp. 2133-2135.

Carter, S. A. et al., "Enhanced luminance in polymer composite light emitting devices," Appl. Phys. Lett., vol. 71, pp. 1145-1147, Sep. 1997.

Chung-Chih, Wu et al., "Efficient organic blue-light-emitting devices with double confinement on terfluorenes with ambipolar carrier transport properties," Advanced Materials, Jan. 5, 2004, vol. 16, No. 1, pp. 61-65.

Colle, M. et al. "Switching and filamentary conduction in non-volatile organic memories," Organic Electronics, 7, 305-312 (Oct. 2006).

Connelly, N. G. et al., "Chemical Redox Agents for Organometallic Chemistry," Chem. Rev., 96, 877 (1996).

Cotton, F. et al., "Closed-shell molecules that ionize more readily than cesium," Science, vol. 298, No. 5600, pp. 1971-1974 (Dec. 6, 2002).

D'Andrade, B.W. et al., "Relationship between the ionization and oxidation potentials of molecular organic semiconductors," Organic Electronics 6, 2005, pp. 11-20.

D'Andrade, Brian W., "Operational stability of electrophosphorescent devices containing p and n doped transport layers," Applied Physics Letters, vol. 83. No. 19, Nov. 10, 2003, pp. 3858-3860.

D'Andrade, Brian W., et al., "Efficient organic electrophosphorescent white-light emitting device with a triple doped emissive layer," Advanced Materials, No. 7, 16, Apr. 5, 2004. pp. 624-628.

D'Andrade, Brian W., et al., "High-efficiency yellow double-doped organic light-emitting devices based on phosphorsensitized fluorescence," Appl. Phys. Lett., (2001), vol. 79:7, pp. 1045-1047.

Day et al. "The use of charge transfer interlayers to control hole injection in molecular organic light-emitting diodes," Thin Solid Films, 410 (2002) pp. 159-166.

Dodabalapur et al., "Organic transistors: Two-dimensional transport and improved electrical characteristics," Science, vol. 268, p. 270 (1995).

Endo, Jun et al., "Organic Electroluminescent Devices with a vacuum-deposited Lewis Acid doped hole injecting layer," Japan Society of Applied Physics, vol. 41, 2002, pp. L358-L360, Part 2, No. 3B, Mar. 15, 2002.

Feng, X.D. et al. "Ohmic Cathode for Low-Voltage Organic Light-Emitting Diodes," App. Phys. Lett., vol. 86, Article 143511 (Apr. 1, 2005): pp. 1-3.

Gao, W. et al., "Effect of electrical doping on molecular level alignment at organic-organic heterojunctions," Applied Physics Letters, vol. 82, No. 26, Jun. 30, 2003, pp. 4815-4817.

Gu, G. et al., "Transparent organic light emitting devices," Applied Physics Letters, (1996), vol. 68:19, pp. 2606-2608.

Gu, G., et al. "Transparent stacked organic light emitting devices. I. Design principles and transparent compound electrodes," Journal of Applied Physics, 1999, vol. 86, No. 8, pp. 4067-4075.

Gufeng, et al., "Very high-efficiency and low voltage phosphorescent organic light-emitting diodes based on a p-i-n junction," Journal of Applied Physics, vol. 95, No. 10, pp. 5773-5777 (May 15, 2004).

Gufeng, He et al., "High-efficiency and low-voltage p-i-n electrophosphorescent organic light-emitting diodes with double-emission layers," Applied Physics Letters, vol. 85, No. 17, Oct. 25, 2004, pp. 3911-3913.

Hack, M. et al. "Status and Opportunities for High Efficiency OLED Displays on Flexible Substrates," Mater. Res. Soc. Symp. Proc., vol. 870E, Article H3.1, Symposium H Giant Area Electronics on Nonconventional Substrates (Mar. 28-Apr. 1, 2005): pp. 1-10.

Harada, K. et al. "Ionized impurity scattering in n-doped C60 thin films," Applied Physics Letters, 91, 092118 (2007).

Harada, K. et al. "Organic Homojunction Diodes with a High Built-in Potential: Interpretation of the Current-Voltage Characteristics by a Generalized Einstein Relation," Phys. Rev. Lett. 94, 036601 (2005).

Higgins, R.W.T. et al. "Emeraldine base polyaniline as an alternative to poly(3,4-ethylenedioxythiophene) as a hole-transporting layer," Advanced Functional Materials, 11, 407-412 (Dec. 1, 2001).

Hino, Yuichi et al., "Efficient low molecule phosphorescent organic light emitting diodes fabricated by wet-processing," Organic Electronics, Aug. 8, 2004, vol. 5, pp. 265-270.

Hong, Il-Hwa et al. "Effective hole injection of organic light-emitting diodes by introducing buckminsterfullerene on the indium tin oxide anode," Applied Physics Letters, 2005, 87, 063502-1.

Hu, Wenping et al., "Efficient red electroluminescence from devices having multilayers of a europium complex," Appl. Phys. Lett. vol. 77, No. 26, Dec. 25, 2000.

Huang, Jingsong et al., "Effect of well number on organic multiple-quantum-well electroluminescent device characteristics," Applied Physics Letters, (1998), vol. 73:23, pp. 3348-3350.

Huang, Jingsong et al., "Influence of the thickness and doping of the emission layer on the performance of organic light-emitting diodes with PiN structures," Journal of Applied Physics (2003), vol. 93:2, pp. 838-844.

Huang, Jingsong et al., "Low operating voltage and high-efficiency organic multilayer electroluminescent devices with p-type doped hole injection layer," Jps. J. Appl. Phys., (2001), vol. 40, pp. 6630-6633.

Huang, Jingsong et al., "Low-voltage organic electroluminescent devices using pin structures," Applied Physics Letters, vol. 80, No. 1, Jan. 7, 2002, pp. 139-141.

Hughes, et al. "Electron transporting materials for organic electroluminescent and electrophosphorescent devices," Journal of Materials Chemistry (2005), vol. 15, pp. 94-107.

Hung, L.S. et al., "Recent progress of molecular organic electroluminescent materials and devices," Materials Science and Engineering Reports, 39, 2002, pp. 143-222.

Ikai, M. et al., "Highly Efficient Phosphorescence From Organic light-emitting devices with an exciton-block layer," Appl. Phys. Lett. vol. 79, No. 2, Jul. 9, 2001.

Ioannidis A. et al., "Hole and electron transport in chloroaluminum phtalocyanin thin films," The Journal of Physical Chemistry B, 1997, vol. 101, pp. 5100-5107.

Ishii, M. et al., "Improvement of organic electroluminescent device performance by in situ plasma treatment of indium-tin-oxide surface," J. Lumin., 1165 (2000).

Kido, Junji; "Recent progress in organic light-emitting devices," Proceedings of the 1st International Display Manufacturing Conference IDMC 2000, Seoul Korea, Sep. 5, 2000, pp. 399-400.

Koch, N. et al., "Optimized hole Injection with Strong Acceptors at Organized-Metal Interfaces," Phys. Rev. Lett., vol. 95, pp. 237601-237603, Nov. 30, 2005.

Krieger et al. "Molecular analogue memory cell based on electrical switching and memory in molecular thin films," Synthetic Metals, 122, 199-202 (May 2001).

Kwong, R.C. et al. "Current Status of Electrophosphorescent Device Stability," Org. Electr., vol. 4 (2003): pp. 155-164.

Kwong, Raymond C., et al., "High operational stability of electrophosphorescent devices," Applied Physics Letters, Jul. 1, 2002, vol. 81, No. 1, pp. 162-164.

Lambert, M.A., "Volume-controlled current injection in insulators," Rep. Progr. Phys. 27, 329 (1964).

Lee et al. "The Effect of C60 doping on the device performance of organic light-emitting diodes," Applied Physics Letters, 86 (2005) 063514 (3 pages).

Lee, et al. "Effects of hydroxyl groups in polymeric dielectrics on organic transistor performance," Applied Physics Letters, 88, 162109 (2006).

Liping, MA et al. "Nonvolatile electrical bistability of organic/metal-nanocluster/organic system," Appl. Phys. Lett. 82, 1419-1421 (Mar. 3, 2003).

Lu, Ping et al., "Synthesis of octasubstituted cyclooctatetrainees and their use as electron transporters in organic light emitting diodes," Journal of the American Chemical Society, 2000, vol. 1222, pp. 7480-7486.

Lupton, J. M. et al., "Bragg scattering from periodically microstructured light emitting diodes," Appl. Phys. Lett., vol. 77, pp. 3340-3342, Nov. 2000.

Ma, E.Y., et al. "Thin Film Transistors for Foldable Displays," IEEE Technical Digest, Electron Devices Meeting, 1997. IEDM '97. (Dec. 7-10, 1997): pp. 535-538.

Madigan, C.F. "improvement of Output coupling efficiency of organic light emitting diodes by backside substrate modification," Appl. Phys. Lett., vol. 76, pp. 1650-1652, Mar. 2000.

Maennig, B. et al. "Controlled p-type doping of polycrystalline and amorphous organic layers: Self-consistent description of conductivity and field-effect mobility by a microscopic percolation model," Physical Review B, 64, 195208 (2001).

Matsumura, M. et al., "Analysis of current-voltage characteristics of organic light emitting diodes having a LiF/Al cathode and an A1-hydroxyquinoline/diamine junction," Applied Physics Letters, 2872 (1998).

Mattoussi, H. et al., "Photoluminescence quantum yield of pure and molecularly doped organic solid films," Journal of Applied Physics, (1999), vol. 86:5, p. 2642.

Miller, L.L. et al., "A simple comprehensive correlation of organic oxidation and ionization potentials," J. Org. Chem., 1972, vol. 37, No. 6, pp. 916-918.

Mori, T. et al., "Electroluminescence of organic light emitting diodes with alternately deposited dye-doped aluminum quinoline and diamine derivative," Journal of Physics D—Applied Physics, (1999), vol. 32:11, pp. 1198-1203.

Murata, Hideyuki et al., "Efficient organic light-emitting diodes with undoped active layers based on silole derivatives," Applied Physics Letters, Jan. 14, 2002, vol. 80, No. 2, pp. 189-191.

Naito, Katsuyuki et al.; "Molecular design, synthesis, and physical properties of nonpolymeric amorphous dyes for electron transport," The Journal of Physical Chemistry A, 1997, vol. 101, pp. 2350-2357.

Ohmori, Yutaka et al., "Fabrication and characteristics of 8-hydroxyquinoline aluminum/aromatic diamine organic multiple quantum well and its use for electrluminescent diode," Applied Physics Letters, (1993), vol. 62:25, pp. 3250-3252.

Ohmori, Yutaka et al., "Observation of spectral narrowing and emission energy shift in organic electroluininescent diode utilizing 8-hydroxyquinoline aluminum/aromatic diamine multilayer structure," Applied Physics Letters, (1993), vol. 63:14, pp. 1871-1873.

Pacios, R., et al., "Charge separation in polyfluorene composites with internal donor/acceptor heterojunctions," Synthetic Metals, 2002, vol. 127, pp. 261-265.

Parker, "On the Problem of Assigning Values to Energy Changes of Electrode Reactions," Journal of the American Chemical Society, 96:17, Aug. 21, 1974, pp. 5656-5661.

Pfeiffer et al., "Controlled p-doping of pigment layers by cosublimation: Basic mechanisms and implications for their use in organic photovoltaic cells," Solar Energy Materials and Solar Cells, vol. 63, pp. 83-99, Jun. 1, 2000.

Pfeiffer, M, et al., "Doped Organic semiconductors: physics and application in light emitting diodes," Organic Electronics, Elsevier, Amsterdam, NL, vol. 4, No. 2/3, Sep. 2003, pp. 89-103, XP001177135, ISSN: 1556-1199.

Pfeiffer, M. et al., "Controlled doping of phthalocyanine layers by cosublimation with acceptor molecules: A systematic Seebeck and conductivity study," Applied Physics Letters, vol. 73, No. 22 Nov. 20, 1998, pp. 3202-3204.

Pfeiffer, Martin et al., "Electrophosphorescent p-i-n organic light-emitting.devices for very-high-efficiency flat-panel displays," Advanced Materials, (2002), vol. 14:22, Nov. 18, 2002, pp. 1633-1636.

Pope, et al., "Single positive or negative carriers in organic crystals," Electronic Processes in Organic Crystals and Polymers, Oxford Science Publications, Oxford University Press, (1999), pp. 202-207.

Potember, R.S. et al. "Electrical switching and memory phenomena in Cu-TCNQ thin films," Appl. Phys. Lett. 34, 405 (1979).

Pudzich, R., et al., "Synthesis and characterization of new oxadizoleamine based spiro-linked fluorescence dyes," Synthetic Metals, 2003, vol. 138, pp. 21-31.

R. Schlaf et al., "Homo/Lumo Alignment at PTCDA/ZnPc and PTCDA/CIInPc Heterointerfaces Determined by Combined UPS and XPS Measurements," J. Phys. Chem. B 1999, 103, pp. 2984-2992.

Redecker, M. et al., "Electron transport in starburst phenylquinoxalines," Applied Physics Letters, Jul. 5, 1999, vol. 75, No. 1, pp. 109-111.

Sakamoto, Gosuke et al., "Significant improvement of device durability in organic light-emitting diodes by doping both hole transport and emitter layers with rubrene molecules," Applied Physics Letters, (1999), vol. 75:6, pp. 766-768.

Sato, N., et al., "Polarization Energies of Organic Solids Determined by Ultraviolet Photoelectron Spectroscopy," J. Chem. Soc. Faraday Trans. 2, 77, 1621 (1981).

Schnitzer, J., "30% External Quantum Efficiency from Surface Textured, Thin-film Light emitting diodes," Applied Phys. Lett., vol. 63, pp. 2174-2176, Oct. 1993.

Shinar, J. "Organic Light-Emitting Devices—A Survey" (Adachi et al. "Design concept of molecular materials for high-performance OLED" p. 43)) AIP-Press, Springer, New York 2004.

Shirota, Yasuhiko et al., "A novel class of emitting amorphous molecular materials as bipolar radical formants: 2-{4-[bis(4- methylphenyl)amino]phenyl}-5-(dimesitylboryl)thiophene) and 2-{4-[bis(9,9-dimethylfluorenyl)amino]phenyl}-5-(dimethylboryl)thiophene," Journal of the American Chemical Society, 2000, vol. 122, pp. 11021-11022.

Shirota, Yasuhiko; "Organic materials for electronic and optoelectronic devices," Journal of Materials Chemistry, 2000, vol. 10, pp. 1-25.

Signerski, et al. "The photovoltaic effect in a heterojunction of molybdenyl phthalocyanine and perylene dye," Journal of Non-Crystalline Solids, North-Holland Physics Publishing; vol. 352, No. 40-41, Nov. 1, 2006, pp. 4319-4324.

Tang, C. W., et al., "Electroluminescence of doped organic thin films," Journal of Applied Physics, (1989), vol. 65:9, pp. 3610-3616.

Tang, C.W. et al., "Organic electroluminescent diodes," Applied Physics Letters, vol. 51, No. 12, Sep. 21, 1987, pp. 913-915.

Tang, T.B. et al., "Ionization thresholds of merocyanine dyes in the solid state," Journal of Applied Physics, vol. 59, (1), Jan. 1986, pp. 5-10.

Tobat, P.; Saragi, I. et al., "Organic phototransfer based on intramolecular charge transfer in a bifunctional spiro compound," Applied Physics Letters, Mar. 29, 2004, vol. 84, No. 13, pp. 2334-2336.

Tokito, Shuzuo et al., "Improvement of emission efficiency in polymer light-emitting devices based on phosphorescent polymers," Thin Solid Films, Dec. 15, 2003, vol. 445, No. 2, pp. 353-357.

Tsiper, E.V. and Soos, Z.G.; "Charge redistribution and polarization energy of organic molecular crystals," Physical Review B; vol. 64; 195124-1, (2001).

Tsutsui, T. et al., "High quantum efficiency in organic light emitting devices with iridium-complex as a triplet emissive center," Jps. Journal of Applied Physics, part 2 letters, (1999), vol. 38:12B, pp. L1502-L1504.

Tsuzuki, T. et al. "The effect of fullerene doping on photoelectric conversion using titanyl phthalocyanine and a perylene pigment," Solar Energy Materials and Solar Cells, Elsevier Science Publishers, Amsterdam, vol. 61, No. 1, Feb. 15, 2000; pp. 1-8.

Vissenberg, M.C. et al. "Theory of the field-effect mobility in amorphous organic transistors," Physical Review B, 27, 12964 (1998).

Volkel, A. R. et al. "Carrier transport and density of state distributions in pentacene transistors," Physical Review B, 66, 195336 (2002).

Wang, S.D. et al. "Bottom contact ambipolar organic thin film transistor and organic inverter based on $C_{60}$/pentacene heterostructure," Organic Electronics, 7 (2006) pp. 457-464.

Werner, A. G. et al., "Pyronin B as a donor for n-type doping of organic thin films," Applied Physics Letters, vol. 82, No. 25, Jun. 23, 2003, pp. 4495-4497.

Werner, A.G. et al., "n-Type Doping of Organic Thin Films Using Cationic Dyes," Adv. Funct. Mater., vol. 14, No. 3 (Mar. 2004): pp. 255-260.

Wu, C.C. et al. "Integration of Organic LEDs and Amorphous Si TFTs Onto Flexible and Lightweight Metal Foil Substrates," IEEE Electron Device Letters, vol. 18, No. 12 (Dec. 1997): pp. 609-612.

Yamamoria, A et al., "Doped Organic Light Emitting Diodes having a 650-nm Thick Hole Transport Layer," Appl. Phys. Lett. vol. 72, No. 17 (Apr. 27, 1998); pp. 2147-2149.

Yamasaki, T. et al., "Organic Light emitting device with an ordered monolayer of silica microspheres as a scattering medium," Appl. Phys. Lett., vol. 76, pp. 1243-1245, Mar. 2000.

Yang, et al., 2003, "Self-assembly and Magnetic Properties of Cobalt Nanoparticles," Appl. Phys. Lett., 82(26): 4729.

Yang, Y. et al. "Organic electrical bistable devices and rewritable memory cells," Appl. Phys. Lett. 80, 2997 (2002).

Yao, Fu et al., "Quantum-chemical predictions of Absolute standard redox potentials of diverse organic molecules and free radicals in acetonitrile," J. Am. Chem. Soc. 2005, 127, pp. 7227-7234.

Yuan et al. "Fullerene-doped hole transport molecular films for organic light-emitting diodes," Applied Physics Letters, 86 (2005) 143509 (3 pages).

Zhi-Ming, Zhang; "Organic light emitting diodes based on new oxadiazole and pyrazoline derivatives," China Physics Letters, 2000, vol. 17, No. 6, pp. 454-456.

Zhou, X et al., "Enhanced hole Injection Into Amorphous Hole-Transport Layers of Organic Light-Emitting Diodes Using Controlled p-Type Doping," Adv. Funct. Mater., 2001, 11, No. 4,pp. 310-314.

Zhou, X. et al., "Low-voltage inverted transparent vacuum deposited organic light-emitting diodes using electrical doping," Applied Physics Letters, vol. 81, No. 2, Jul. 29, 2002 pp,922-924.

Zhou, X., et al. "High-efficiency electrophosphorescent organic light-emitting diodes with double light-emitting layers," Applied Physics Letters, Nov. 18, 2002, vol. 81, No. 21, pp. 4070-4072.

Final Office Action, U.S. Appl. No. 11/426,798; Dec. 30, 2009.
Non-Final Office Action, U.S. Appl. No. 11/426,798; Jun. 24, 2009.
Restriction Requirement, U.S. Appl. No. 11/426,798; Mar. 10, 2009.
Response to Office Action, U.S. Appl. No. 11/426,798; Oct. 22, 2009.
International Search Report for PCT/EP2007/003311; Nov. 1, 2007.
European Search Report and Opinion for EP05028081.7; May 18, 2006.
International Search Report for PCT/EP2006/012403; Mar. 28, 2007.
International Search Report for PCT/DE2005/001076; Dec. 20, 2005.
Canadian Search Report for Application No. 2543276; Aug. 24, 2009.
Non-final Office Action for U.S. Appl. No. 11/279,514; Jan. 14, 2010.
Response to Office Action for U.S. Appl. No. 11/279,514; Aug. 12, 2009.
Final Office Action for U.S. Appl. No. 11/279,514; May 13, 2009.
Response to Office Action for U.S. Appl. No. 11/279,514; Feb. 27, 2009.
Non-final Office Action for U.S. Appl. No. 11/279,514; Oct. 30, 2008.
Restriction Requirement for U.S. Appl. No. 11/279,514; Jul. 2, 2008.
Supplemental Notice of Allowability for U.S. Appl. No. 10/515,935; Jul. 27, 2007.
Notice of Allowance for U.S. Appl. No. 10/515,935; Jun. 5, 2007.
Office Action for U.S. Appl. No. 10/515,935; Aug. 14, 2006.
International Search Report for PCT/EP2007/011353; Apr. 28, 2008.
International Search Report for PCT/DE2006/000328; May 19, 2006.
Non-Final Office Action for U.S. Appl. No. 12/158,582; Feb. 4, 2010.
International Search Report for PCT/EP2006/012517; Mar. 20, 2007.
International Search Report for PCT/EP2007/000211; Mar. 12, 2007.
European Search Report/Opinon for EP 06026743.2; Nov. 7, 2007.
International Search Report for PCT/DE2005/001493; Jan. 19, 2006.
International Search Report for PCT/DE2008/000638; Sep. 11, 2008.
Non-Final Office Action for U.S. Appl. No. 11/421,249; Oct. 19, 2009.
Response to Office Action for U.S. Appl. No. 11/421,249; Aug. 20, 2009.
Final Office Action for U.S. Appl. No. 11/421,249; May 20, 2009.
Response to Office Action for U.S. Appl. No. 11/421,249; Mar. 18, 2009.
International Search Report for PCT/EP2006/012516; Mar. 27, 2007.
Non-Final Office Action for U.S. Appl. No. 11/574,058; Dec. 9, 2009.
Disclosure Under 37 C.F.R. 1.56 for U.S. Appl. No. 12/534,394 Submitted Herewith.

* cited by examiner

ORGANIC FIELD-EFFECT TRANSISTOR

CROSS-REFERENCE TO RELATED APPLICATION

Applicants hereby claim priority under 35 U.S.C. 119(a) to German Patent Application No. 102008036063.5, filed Aug. 4, 2008, the disclosure of which is expressly incorporated herein by reference in its entirety.

FIELD OF THE INVENTION

The invention relates to an organic field-effect transistor, in particular an organic thin-layer field-effect transistor.

BACKGROUND OF THE INVENTION

Organic semiconductors have received a great deal of attention in recent years owing to their low costs, the possibility of tailoring them to suit large areas and flexible substrates and the vast selection of corresponding molecules. Organic semiconductors can be installed in switchable components such as transistors and also in optoelectronic components such as organic light-emitting diodes (OLEDs) and photovoltaic cells.

Organic transistors, in particular organic field-effect transistors (OTFT), have been investigated and developed for many years now. It is anticipated that a large number of OTFTs can be used for example in inexpensive integrated circuits for non-contact identification tags (RFID) but also for screen control (Backplane). In order to achieve inexpensive applications, generally thin-layer processes are required to manufacture the transistors. In recent years performance features have been improved to such an extent that the commercialization of organic transistors is foreseeable. For example, in OTFTs high field-effect mobilities of up to 6 $cm^2/Vs$ for electrons on the basis of fullerene C60 and up to 5.5 $cm^2/Vs$ for holes on the basis of pentacene (Lee et al., Appl. Lett. 88, 162109 (2006)) have been reported.

Charge carrier transport in thin organic layers is generally described by temperature-activating charge carrier hopping which leads to relatively low mobilities and a strong influence of disorder. Therefore the field-effect mobility in OTFTs generally depends upon the charge carrier density (Vissenberg et al., Phys. Rev. B 57, 12 964 (1998)), Horowitz et al., Phys. Rev. B 66, 195336 (2002)). A relatively high gate voltage is generally necessary in order to fill localized states which do not contribute to electric transport and in order to achieve a high level of charge carrier mobility in the organic layer.

One option for increasing the charge carrier density and as a consequence also the charge carrier mobility in organic semiconductors is electrical doping using donors or acceptors. In so doing, by creating charge carriers in a matrix material, the Fermi level in the semiconductor is changed and also, depending upon the type of donors used, the initially quite low level of conductivity is increased. Document U.S. Pat. No. 5,093,698 describes general requirements placed on combinations of organic materials for electrical doping.

Electrical doping of organic semiconductors using molecular dopants has been investigated in detail over recent years. These investigations have shown that the mobility of mixed-layers increases depending upon the doping concentration. This phenomenon is explained by the fact that additional charge carriers gradually fill states of the matrix material from the lower distribution end of the density of states, i.e. states with low mobility (Maenning et al., Phys. Rev. B 64 195208 (2001)). In so doing, the Fermi level of the semiconductor is gradually changed to the same extent depending upon the type of donor used. It is increased in the case of n-doping. It is reduced for p-doping. This also increases the initially quite low level of conductivity.

In OTFTs which have an electrically doped active layer, the increased mobility also reduces the threshold voltage and thus also in general the operating voltage. For most areas of application for OTFTs it is desirable to achieve extremely low Off-currents. A high doping concentration creates a high background charge density which in turn leads to an undesired ohmic charge carrier transport which cannot be effectively controlled by the field effect.

The term 'Off-state of a transistor' is understood here to be an applied gate voltage smaller than the threshold voltage of the component for n-type conductors and greater than the threshold voltage for p-type conductors. In the case of the generally discussed OTFT in the enhancement mode the Off-state is present with the gate voltage $V_g=0$ V for p- and n-type.

However, it was found that in semiconductor layers with excellent charge carrier mobility the addition of donors increased the impurity scattering and thus also limited the maximum mobility in OTFT. (Harada et al., Appl. Phys. Lett. 91 092118 (2007)). An alternative arrangement is therefore desirable, where the charge carrier background concentration is increased without mixing donors in the semiconductor layer. In principle, such an arrangement allows to increase the charge carrier mobility above the usual amount.

The properties of the various materials used during an electric doping process can also be described by the energy layers of the lowest unoccupied molecular orbital (LUMO, synonym: ionization potential) and of the highest occupied molecular orbital (HOMO, synonym: electron affinity).

Ultraviolet photoelectron spectroscopy (UPS) is one method of determining the ionization potentials (IP). Generally, ionization potentials are determined for the solid state body, however, it also possible to measure the ionization potentials in the gas phase. Both parameters differ as a result of the solid state body effects such as, for example, the polarization energy of the holes which occur during the photo-ionization process. A typical value for the polarization energy is approx. 1 eV, but greater deviations therefrom can also occur. The ionization potential relates to the beginning of the photo-emission spectrum in the range of the high kinetic energies of photoelectrons, i.e. the energy of the weakest bound photoelectrons. Inverted photo electron spectroscopy (IPES) which is one method associated with this can be used to determine electron affinities ($E_A$). However, this method is not widely used. Alternatively, solid state body energy levels can be determined by electrochemical measurements of oxidation potentials $E_{ox}$ or reduction potentials $E_{red}$ in solution. One suitable method is for example cyclic voltammetry.

There are no known empirical formulae for converting reduction potentials into electron affinities. This is because of the difficulty in determining the electron affinities. A simple rule is therefore frequently used: IP=4.8 eV+e*$E_{ox}$ (see Ferrocene/Ferrocenium) or $E_A$=4.8 eV+e*$E_{red}$ (in comparison to Ferrocene/Ferrocenium) (cf. Andrade, Org. Electron. 6, 11 (2005)). In the event that other reference electrodes or redox pairs are used to reference electrochemical potentials, there are known methods for the conversion.

It is usual to use the terms "Energy of HOMOs" E(HOMO) or "Energy of the LUMOs) E(LUMO) synonym with the terms ionization energy or electron affinity (Koopmans Theorem). It is to be noted that the ionization potentials and electron affinities are such that a higher value represents a stronger bond of a removed or rather attached electron. Therefore the global approximation: IP=−E(HOMO) and EA=−D (LUMO) applies.

OTFTs with arrangements of additional layers on the active semiconductor layer, which additional layers are also designated as encapsulation or cover layer, have been described. For example, double layers of pentacene and $C_{60}$ are used to achieve ambipolar component functionality (Wang et al., Org. Electron. 7,457 (2006)). In this special case, it can be derived from the energy levels that there has been no technically relevant change in the charge carrier density in the active layer. Document US 2007/034860 also describes such a structure and even claimed a higher mobility for the active layer in comparison to the encapsulation layer.

SUMMARY OF THE INVENTION

The object of the invention is to provide an improved organic field-effect transistor which provides a high mobility for the electric charge carrier.

This object is achieved in accordance with the invention by means of an organic field-effect transistor, in particular organic thin-layer field-effect transistor having a gate electrode, a drain electrode, a source electrode, an active layer of organic material which is configured to form an electric line channel during the operation, a dielectric layer which electrically isolates the active layer from the gate electrode, a dopant material layer which consists of a molecular dopant material whose molecules consist of two or more atoms and which is an electrical dopant for the organic material of the active layer and wherein the dopant material layer is formed in a boundary surface region between the active layer and the dielectric layer or adjacent to the boundary surface region. Advantageous embodiments of the invention are the subject of the dependent subordinate claims.

The invention encompasses the idea of an organic field-effect transistor, in particular an organic thin-layer field-effect transistor, with a gate electrode, a drain electrode and a source electrode, an active layer of organic material which during the operation forms an electrical line channel, a dielectric layer which electrically isolates the active layer from the gate electrode, a dopant material layer which consists of a molecular dopant material whose molecules consist of two or more atoms and which dopant material is an electric donor for the organic material of the active layer, and wherein the dopant material layer is formed in a boundary layer between the active layer and the dielectric layer or is formed adjacent to the boundary region.

With the aid of the dopant material layer which is disposed either in the boundary region between the active layer and the dielectric layer or adjacent thereto, there occurs in the regions of the active layer adjacent to the dopant material layer a quasi-doping in the form of electrical doping which relates to a partial charge transfer between on the one hand the molecular dopant material and the organic material of the active layer on the other hand. Impurities in the active layer which during operation cause the charge carriers, namely electrons or holes, to be trapped in the conducting channel which reduces the mobility of the charge carrier within the conducting channel are saturated so that these saturated impurities no longer hinder the flow of current in the conducting channel within the active layer. Unsaturated impurities result in electrons or holes being trapped here, so that these charge carriers become trapped on numerous occasions in the impurities and then released again on their way through the conducting channel between the source electrode and drain electrode. This disadvantage effect is substantially reduced or even completely eliminated with the quasi-doping.

The dopant material layer can be formed either as a closed layer or a non-closed layer. The closed or non-closed layer which for example is formed from several separate partial regions can be limited to a partial section of the extension of the boundary region. The thickness of the dopant material layer is preferably at a maximum one tenth of the thickness of the active layer.

Methods for determining the charge carrier mobility in a field-effect transistor are known as such in various formats. One example is disclosed in the document US 2004/191952A. The mobility for a specific gate voltage is calculated from the saturation region of a current-voltage characteristic curve between the source electrode and the drain electrode.

An organic or inorganic material can be used as the molecular dopant material. The organic material of the active layer and the molecular dopant material in the dopant material layer form a combination of materials, where, if they are disposed thoroughly mixed in one layer, electric doping occurs which relates to the partial charge transfer between the two materials. In the case of the field-effect transistor proposed here the organic material is however located in the active layer, whereas the molecular dopant material forms the layer of dopant material.

The molecular dopant material can be an electric dopant in the form of an acceptor or a donor for the organic material of the active layer. In the event that the electrical dopant is formed as a donor, an organic field-effect transistor of the n-type is formed. An organic field-effect transistor of the p-type is formed if the electrical dopant is an acceptor for the organic material of the active layer.

The doping in conjunction with the electrical conductivity is characterized by a charge transfer. The charge transfer can be incomplete or complete and can be measured for example by evaluating the vibration bonds of an FTIR (fourier-transformed infrared-spectroscopy).

Donors are used as n-dopants. A dopant is a molecule and/or a neutral radical with a HOMO-level (solid state body ionization potential) which is less than 3.3 eV, preferably less than 2.8 eV and more preferably less than 2.6 eV or a gas phase ionization potential of less than approx. 4.3 eV, preferably less than approx. 3.8 eV and more preferably less than approx. 3.6 eV. The HOMO-level of the dopant can be determined from the cyclic voltammetric measurements of the oxidation potential. Alternatively, the reduction potential of the donor cation can be determined in a salt of the donor. The donor should have an oxidation potential which in comparison to $Fc/Fc^+$ (Ferrocene/Ferrocenium Redox pair) is less than or equal to approx. −1.5 V, preferably less than or equal to approx. −2.0 V and more preferably less than or equal to approx. −2.2 V.

Acceptors are used as p-dopants. An acceptor is a molecule or/and a neutral radical with a LUMO level which is greater than approx. 4.5 eV, preferably greater than approx. 4.8 eV and more preferably greater than approx. 5.04 eV. The LUMO level of the acceptor can be determined from cyclic voltammetric measurements of the reduction potential. The acceptor has a reduction potential which in comparison to $Fc/Fc^+$ is greater than or equal to approx. −0.3 V, preferably greater than or equal to approx. 0.0 V and more preferably greater than or equal to approx. 0.24 V. Molar mass of the acceptors between 100 and 2000 g/mol, preferably between 200 and 1000 g/mol, more preferably between 300 g/mol and 2000 g/mol.

The dopant is preferably metal-free.

In a further embodiment the dopant is a material which has a glass transition temperature (Tg) of more than approx. 100° C. In the case of materials which are not characterized by a glass transition temperature, these materials are in a solid state at temperatures of less than approx. 100° C.

The acceptor can be formed from a pre-cursor during the layer-producing process or during the subsequent layer-producing process. The LUMO level of the acceptor quoted above then relates to the species produced. Dopants for the p-doping of organic matrix materials can be chinone and polychinone such as chloranil, tetracyanochinodimethane such as $F_4TCNQ$ or Lewis acids such as $FeCl_3$.

Molecular dopants for the n-doping of organic matrix materials can be for example: metal complexes, in particular paddlewheel complexes such as tetrakis(1,3,4,6,7,8-hexahydro-2H-pyrimido[1,2-a]pyrimidinato)dichrom (II) or tetrakis(1,3,4,6,7,8-hexahydro-2H-pyrimido[1,2-a]pyrimidinato)ditungsten (II), or heteroaromatic metal complexes such as bis(2,2'-terpyridin)ruthenium; metal organic complexes such as cobaltocene or (eta6-benzene)(eta5-zyklopentadienyl) iron (II); cationic dye such as crystal violet chloride or pyronin B chloride; whose Leuko-bases such as for example Leuko-crystal violet; Lewis-bases such as acridine orange base; tetrathiafulvalen-derivates such as tetrathiafulvalene or bis(ethylen-dithiolo)tetrathiofulvalen.

The electrodes and the several layers of the organic field-effect transistors are generally formed on a substrate, for example as thin layers. It is possible to provide that with the substrate itself there are already one or several electrodes available which form the electrode(s) i.e. substrate or one or several electrodes are forming the substrate, for example by using a silicon substrate. The drain contact and the source contact or alternatively the gate electrode can be formed on or in the substrate.

A preferred further embodiment of the invention provides that the dopant material layer adjacent to the boundary layer is formed in the dielectric layer.

One development of the invention preferably provides that the dopant material layer adjacent to the boundary region is formed in the active layer.

A further development of the invention can provide that the dopant material layer is formed at a spaced disposition of approx. one to approx. three monolayers.

An advantageous embodiment of the invention provides that the dopant material layer is formed with a layer thickness of approx. 0.5 nm to approx. 5 nm.

A development of the invention preferably provides that the molecular dopant material has a molar mass between approx. 100 g/m and approx 2000 g, preferably between approx. 200 g/mol and approx. 1000 g/mol A development of the invention preferably provides that the molecular dopant material has more than six atoms, preferably more than twenty atoms.

It can be provided in one embodiment that the dopant material has a glass transition temperature (Tg) of greater than 75° C., preferably greater than 100° C. and more preferably greater than 200° C. In this way, stable electric properties are created. By means of a high Tg the diffusion from the dopant material is minimized and the layers retain their original properties and functions.

It is advantageous if the dopant material layer is thermally stable which supports the thermal stability of the organic field-effect transistor. A good thermal stability is provided if the molecule has a high molar mass, contains a large number of atoms and has a higher Tg. This can be measured in that the ambient temperature for the transistor can be increased slowly, for example from room temperature to approx. 300° C., for example in steps from 1° C. and in so doing the current to a given source-drain voltage and a given gate voltage measured. A greater deviation or a sudden deviation of the current then points to the maximum temperature at which the transistor is still stable.

The dopant material layer can be formed either as a closed layer or a non-closed layer. The closed or non-closed layer which for example is formed from several separate partial regions can be limited to a partial section of the extension of the boundary region. The thickness of the dopant material layer is preferably at a maximum one tenth of the thickness of the active layer.

DETAILED DESCRIPTION OF EMBODIMENTS

The invention is further described hereinunder with reference to exemplified embodiments with reference to figures of a drawing. The drawings show:

FIG. 1 a schematic illustration of an organic field-effect transistor with a channel doping, a dopant material layer being arranged in the boundary region between an active layer and a dielectric layer.

Figure 2:
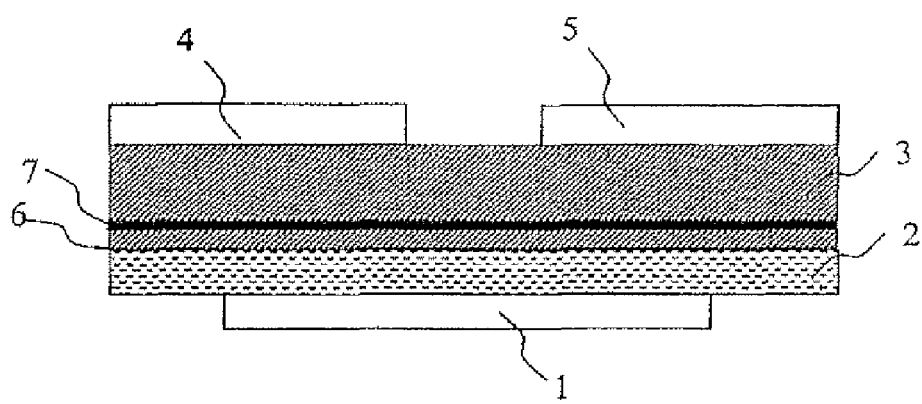
Figure 3:
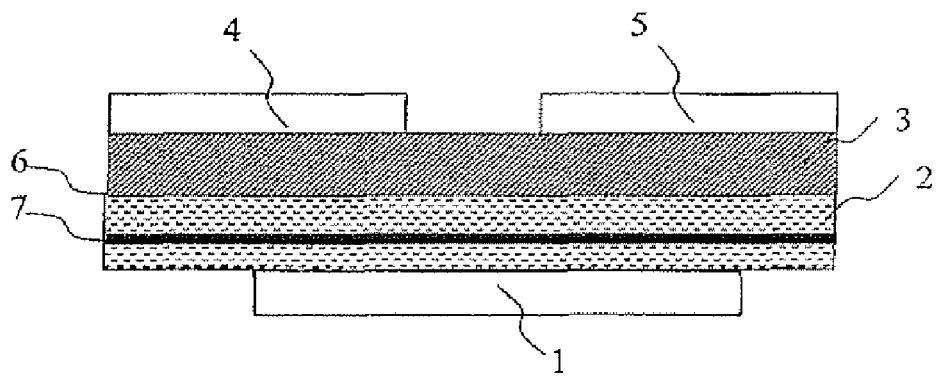
Figure 4:
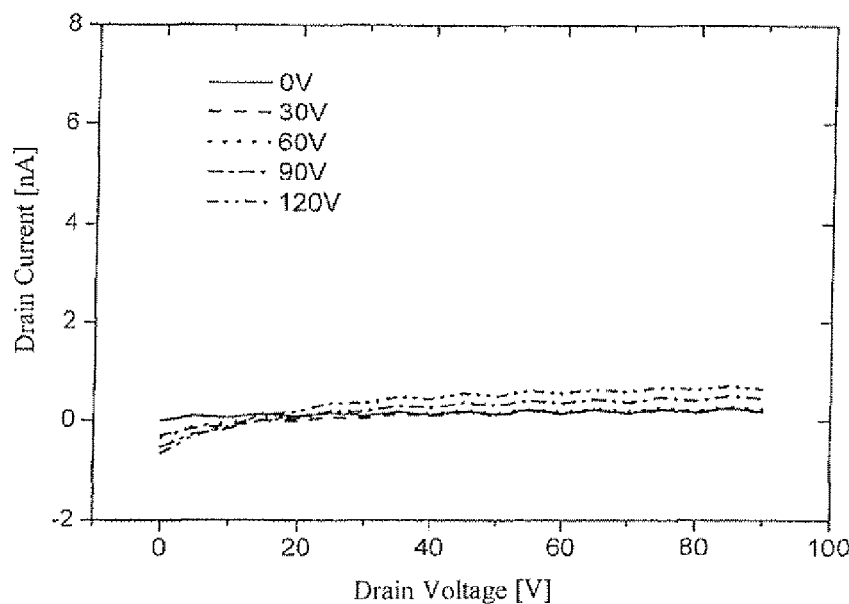
Figure 5:
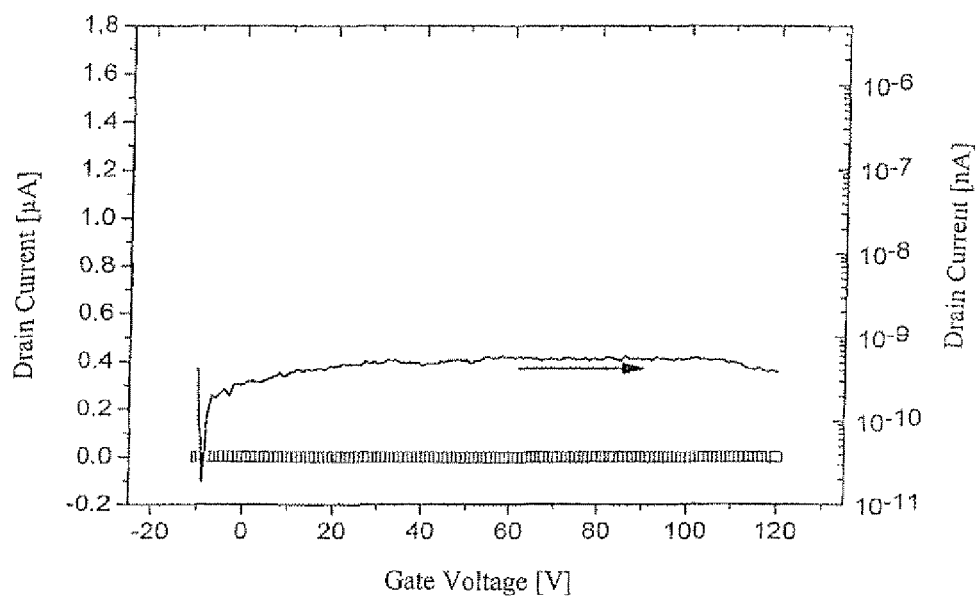
Figure 6:
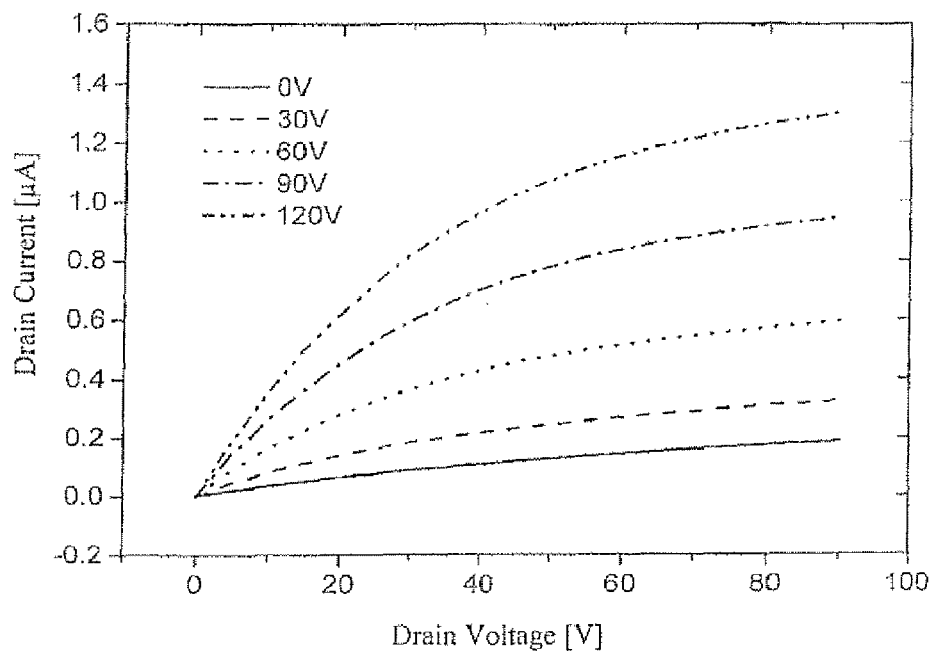
Figure 7:
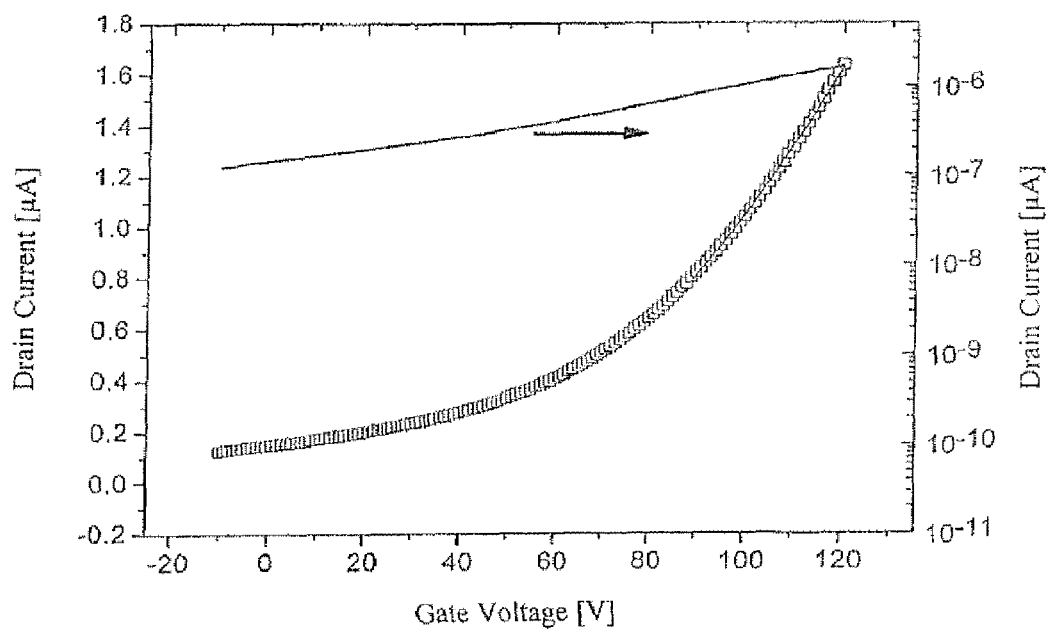
Figure 8:
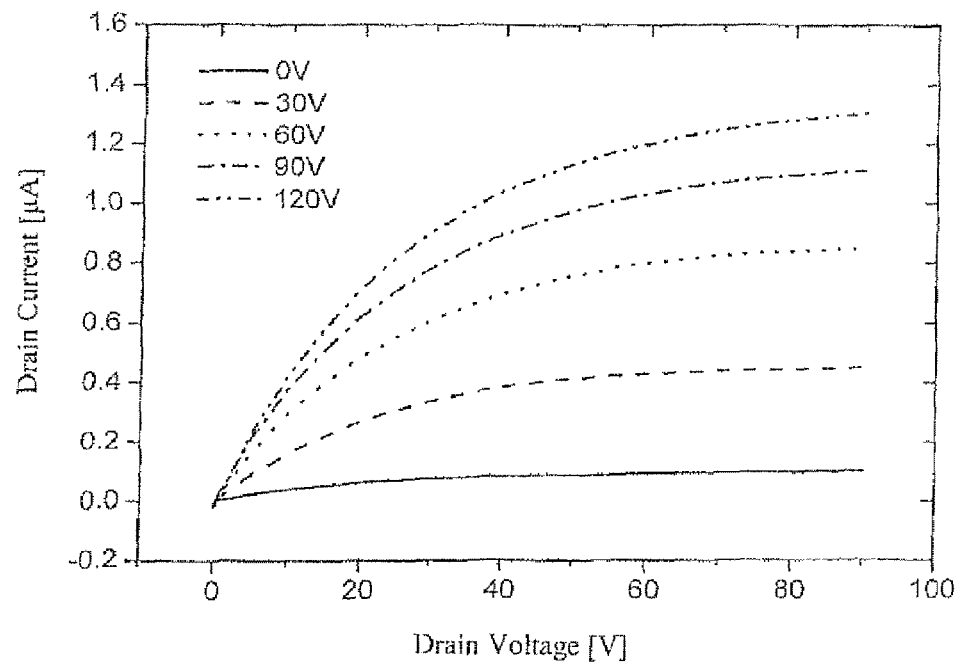
Figure 9:
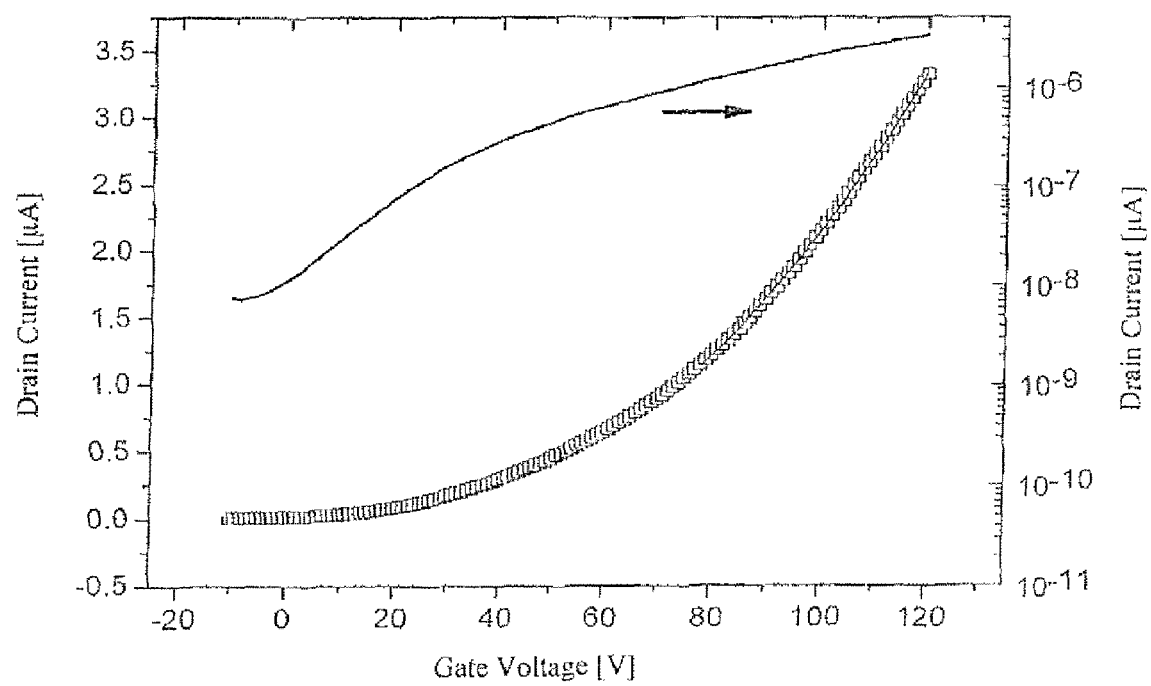

FIG. 2 a schematic illustration of an organic field-effect transistor with a channel doping, wherein a dopant material layer is arranged adjacent to the boundary region between the active layer and the dielectric layer and in the active layer, FIG. 3 a schematic illustration of an organic field-effect transistor with a channel doping, wherein the dopant material layer is arranged adjacent to the boundary region between the active layer and the dielectric layer and in the dielectric layer, FIG. 4 a graphic illustration of the drain current depending on the drain voltage for a known organic field-effect transistor for comparison, FIG. 5 a graphic illustration of the drain current depending on the gate voltage for the known organic field-effect transistor for comparison, FIG. 6 a graphic illustration of the drain current depending on the drain voltage for an organic field-effect transistor with channel doping, FIG. 7 a graphic illustration of the drain current depending on the gate voltage for an organic field-effect transistor with channel doping as in FIG. 6, FIG. 8 a graphic illustration of the drain voltage depending on the drain voltage for a further organic field-effect transistor with channel doping and FIG. 9 a graphic illustration of the drain voltage depending on the gate voltage for the further organic field-effect transistor with channel doping as in FIG. 8, FIG. 1 shows a schematic illustration of an organic field-effect transistor with a channel doping, where a dielectric layer is formed on a gate electrode 1, the said dielectric layer electrical isolates the gate electrode 1 from an active layer 3 of organic material in which during operation an electric conducting channel is formed by means of the field effect. A source electrode 4 and a drain electrode 5 are formed above the active layer 3 of organic material.

A dopant material layer 7 comprising a molecular dopant material is produced in the boundary region 6 between the dielectric layer 2 and the active layer 3 of organic material. The molecular dopant material is an electrical dopant for the organic material of the active layer 3. The dopant material layer 7 provides a spatially defined doping in the active layer 3, so that impurities are saturated in the active layer 3. These impurities thus no longer hinder the current flow in the conducting channel in the active layer during operation of the organic field-effect transistor.

FIGS. 2 and 3 show schematic illustrations of further organic field-effect transistors with a channel doping, wherein for the identical features in FIGS. 2 and 3 the same reference numbers as in FIG. 1 are used.

In the embodiment in FIG. 2, the dopant material layer 7 is arranged adjacent to the boundary region 6 between the dielectric layer 2 and the active layer 3 in the active layer 3.

It is assumed that when applying a gate voltage the charge carrier density is inhomogeneously distributed in the electric line channel in the active layer 3 in the organic field-effect transistors. Practically the entire charge transport should take place within the first monolayers of the active layer 3, which are adjacent to the boundary region 6 (cf. for example A. Dodabalapur, et al., Science 268, 270 (1998)). A monolayer here characterizes a layer of molecules of the material of the active layer 3 above the boundary region 6, wherein the layer height amounts to only one molecule. The absolute layer thickness of a monolayer depends in the case of the molecules on the orientation in which the molecules are arranged on the substrate surface in relation to the boundary region 6. Typical values for the thickness of a monolayer in the case of the organic semiconductor pentacene are, for example, depending upon the molecule arrangement 1.5 nm to 4 nm. The spaced disposition of the dopant material layer 7 with respect to the boundary region 6 preferably amounts to a few monolayers of the semiconductor material, for example, 1 to 3 molecular monolayers.

In the embodiment in FIG. 3, the dopant material layer 7 is now formed adjacent to the boundary region 6 in the dielectric layer 2.

In the various embodiments in FIGS. 1 to 3, the provision of the dopant material layer 7 in the boundary region 6 between the dielectric layer 2 and the active layer 3 or adjacent thereto provides a spatially defined electric doping in the active layer 3 and thus adjacent to the electric line channel which is formed therein during the operation. This can also be described as channel doping.

In particular in semiconductors which can be grown in a (multi-)crystalline fashion in thin layers, for example pentacene, it is possible to reduce the crystallinity by introducing the dopant material layer 7 directly in the region of the boundary 6 to the dielectric layer 2, which results in additional scatter processes which can have an adverse effect on the mobility of the charge carrier in the active layer 3. The embodiments in FIG. 2 and FIG. 3 in particular take this into account, where the dopant material layer 7 is applied adjacent to the boundary region 6.

FIG. 4 shows a graphic illustration of the drain current depending on the drain voltage for a known organic field-effect transistor for comparison.

FIG. 5 shows a graphic illustration of the drain current depending on the gate voltage for the known organic field-effect transistor for comparison. The measured values for a known organic field-effect transistor were acquired on the basis of pentacene with a contact at the top. The source electrode and the drain electrode consist of silver. The active layer is pentacene. The dielectric layer is cross-linked poly (4-vinylphenol). The gate electrode is produced from indium tin oxide (ITO). The characteristic lines illustrated show that the drain current lies in the nA-range. No significant field effect from the n-type was observed.

FIG. 6 shows a graphic illustration of the drain current depending on the drain voltage for an organic field-effect transistor with channel doping. In comparison to the known organic field-effect transistor for which the values are shown in FIGS. 4 and 5, a dopant material layer with a layer thickness of 2 nm in 10c,10c'-Bi(2,3,5,6-tetrahydro-1H,4H-3a,6a, 10b-triazafluranthenyl is provided in addition between the dielectric layer and the active layer in pentacene. As a result, the initial characteristic curve field has currents in the μA range. A typical characteristic curve for an n-type transistor of the enhancement mode is created. FIG. 7 shows a graphic illustration of the drain current depending on the drain voltage. The technical characteristics of the transistor are as follows: Mobility $\mu=9\times10^{-4}$ cm$^2$/Vs, threshold voltage $V_{TH}=18$ V, On/off ratio (120V/0V)≈10.

FIG. 8 shows a graphic illustration of the drain current depending on the drain voltage for a further organic field-effect transistor with channel doping. FIG. 9 shows a graphic illustration of the drain current depending on the gate voltage for the further organic field-effect transistor with channel doping as in FIG. 8.

In the case of the organic field-effect transistor being measured a pentacene layer with a thickness of 4 nm was initially also deposited on the dielectric layer, the said pentacene layer corresponding approx. to a monolayer of this material. A 2 nm thick layer of 10c,10'-Bi(2,3,5,6-tetrahydro-ich, 4H-3a,6a, 10b-triazafluranthenyl) was deposited onto this pentacene layer. A further layer of pentacene with a thickness of 50 nm was then applied to this layer. Except for the 2 nm thick layer of molecular dopant material the structure of the organic field-effect transistor corresponds to the transistor for which the values were measured in FIGS. 4 and 5. As a result, the initial characteristic curve field has currents in the μA range. A typical characteristic for an n-type transistor of the enhancement mode is evident. The technical characteristics of the transistor are: Mobility $\mu=\mathbf{1.9\times10^{-3}}$ cm$^2$/Vs, threshold voltage $V_{TH}=19$ V, on/off ratio (120V/0V)≈300. Both mobility and also the on/off ratio are better in the case of this transistor than in the case of the transistor illustrated in FIG. 6 and FIG. 7.

It was demonstrated that the thickness of the dopant material layer can purposefully influence the threshold voltage. The on/off ratio and the effective charge carrier mobility in the electric conducting channel achieve a maximum in the case of the chosen layer thickness of 2 nm. The layer thickness and position of the dopant material layer therefore produce two parameters which can be varied depending upon the individual application.

Examples for organic materials which can be used for the active layer 3 are the following materials: fullerene C60 and C70 and derivatives; pentacene and derivatives; rubrene; oligothiophenes and derivatives; phthalocyanine and metallophthalocyanine, and derivatives; PTCDI, perylenetetracarboxylic diimide, and derivatives; PPV, poly(p-phenylenevinylene), and derivatives; PTV Poly(2,5-thienylenevinylene), and derivates; P3HT poly(3-hexythiophene), and derivatives; PFO, Poly(9,9-dioctyliluoreiie), and derivatives; PCMB, [6,6]-phenyl C61-butyric acid methyl ester, and derivatives.

The following materials are examples of donors which are able to perform a charge transfer under normal conditions with the molecules of the active layer 3: Ru(terpy)2, bis(2,2': 6',2"-terpyridin)ruthenium and tetrakis(1,3,4,6,7,8-hexahydro-2H-pyrimido[1,2-a]pyrimidiato)ditungsten.

The following materials are examples of acceptors which are able to perform a charge transfer under normal conditions with the molecules of the active layer 3: F4-TCNQ, 2,3,5,6-tetrafluoro-7,7,8,8-tetracyanoquinodimethane, and N,N'-dicyano-2,3,5,6,7,8-hexyluoro-1,4-naphthoquinonediimine.

The features of the invention disclosed in the aforementioned description, claims and the drawing can be of importance in their various embodiments both individually and also in any combination for the implementation of the invention.

The invention claimed is:

1. An organic field-effect transistor comprising:
a gate electrode, a drain electrode, and a source electrode;
an active layer comprising an organic material, wherein the active layer forms an electric conducting channel during operation;
a dielectric layer, wherein the dielectric layer is arranged between the active layer and the gate electrode; and a dopant material layer, wherein the dopant material layer comprises a molecular dopant material, wherein the molecular dopant material comprises at least one molecule comprising two or more atoms, and wherein the at least one molecule is an electrical dopant for the organic material of the active layer, wherein a boundary surface region comprises an area between the active layer and the dielectric layer, and wherein the dopant material layer is arranged adjacent to the boundary surface region, and wherein the dopant material layer is arranged at a distance of about one to about three monolayers from the boundary surface region.

2. The field-effect transistor according to claim 1, wherein the dopant material layer is arranged in the dielectric layer.

3. The field-effect transistor according to claim 1, wherein the dopant material layer is arranged in the active layer.

4. The field-effect transistor according to claim 1, wherein the dopant material layer has a thickness of about 0.5 nm to about 5 nm.

5. The field-effect transistor according to claim 1, wherein the molecular dopant material has a molar mass between about 100 g/mol and about 2000 g/mol.

6. The field-effect transistor according to claim 1, wherein the molecular dopant material is metal-free.

7. The field-effect transistor according to claim 1, wherein the molecular dopant material has a glass transition temperature (Tg) of more than about 100° C.

8. An organic field-effect transistor comprising:
a gate electrode, a drain electrode, and a source electrode;
an active layer comprising an organic material, wherein the active layer forms an electric conducting channel during operation;
a dielectric layer, wherein the dielectric layer is arranged between the active layer and the gate electrode; and a dopant material layer, wherein the dopant material layer comprises a molecular dopant material, wherein the molecular dopant material comprises at least one molecule comprising two or more atoms, and wherein the at least one molecule is an electrical dopant for the organic material of the active layer, wherein a boundary surface region comprises an area between the active layer and the dielectric layer, wherein the dopant material layer is arranged spaced away from the boundary surface region and embedded in the dielectric layer.

9. An organic field-effect transistor comprising:
a gate electrode, a drain electrode, and a source electrode;
an active layer comprising an organic material, wherein the active layer forms an electric conducting channel during operation;
a dielectric layer, wherein the dielectric layer is arranged between the active layer and the gate electrode; and a dopant material layer, wherein the dopant material layer comprises a molecular dopant material, wherein the molecular dopant material comprises at least one molecule comprising two or more atoms, and wherein the at least one molecule is an electrical dopant for the organic material of the active layer, wherein a boundary surface region comprises an area between the active layer and the dielectric layer, wherein the dopant material layer is arranged adjacent to the boundary surface region and embedded in the active layer.

* * * * *